(12) United States Patent
Park et al.

(10) Patent No.: US 6,469,392 B2
(45) Date of Patent: Oct. 22, 2002

(54) CONDUCTIVE LINES WITH REDUCED PITCH

(75) Inventors: Young-Jin Park, Kyungki-do (KR); Gerhard Mueller, Meitingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/751,492

(22) Filed: Dec. 28, 2000

(65) Prior Publication Data
US 2002/0084530 A1 Jul. 4, 2002

(51) Int. Cl.$^7$ ................... H01L 23/528; H01L 23/52
(52) U.S. Cl. ............................................. 257/775
(58) Field of Search ........................................... 257/775

(56) References Cited

U.S. PATENT DOCUMENTS

| | | | | |
|---|---|---|---|---|
| 5,471,095 A | * | 11/1995 | Kaminaga et al. | 257/755 |
| 5,726,498 A | * | 3/1998 | Licata et al. | 257/773 |
| 6,114,723 A | * | 9/2000 | Leu | 257/316 |
| 6,229,214 B1 | * | 5/2001 | Jang | 257/775 |

* cited by examiner

*Primary Examiner*—Allan R. Wilson
(74) *Attorney, Agent, or Firm*—Stanton Braden

(57) ABSTRACT

An integrated circuit having conductive lines with non-rectangular shaped cross-sections. The non-rectangular shaped cross-sections facilitate a reduction in line pitch without increasing capacitive coupling noise between adjacent conductive lines or, alternatively, reduction in capacitive coupling noise between adjacent lines for a given pitch.

24 Claims, 6 Drawing Sheets

CONDUCTIVE LINES WITH REDUCED PITCH

FIELD OF THE INVENTION

The present invention relates to integrated circuits and, more particularly, to integrated circuits with conductive lines with reduced line pitch.

BACKGROUND OF THE INVENTION

In integrated circuits, parallel conductive lines are widely used to interconnect circuit elements. FIG. 1 shows parallel conductive lines 120 separated by line spaces 130 on a substrate 101. The width of the line spacing and conductive line is referred to as the "line pitch". A limiting factor to reducing the line pitch is the minimum resolution or feature size (F) of a specific lithographic tool. With the line spacing and line width equal to 1F each, the minimum pitch is 2F.

One technique for reducing line pitch below 2F is to reduce the width of the line spacing between conductive lines. However, reducing the line spacing brings conductive lines together. This results in an increase in the capacitive coupling noise, which can adversely impact the integrity of signals on adjacent conductive lines.

As evidenced from the foregoing discussion, it is desirable to provide conductive lines with less to 2F pitch without increasing the capacitive coupling between adjacent lines.

SUMMARY OF THE INVENTION

The invention relates to integrated circuit in general. In one embodiment, the integrated circuit comprises conductive lines having non-rectangular shaped cross-sections. The conductive lines are separated by a line space. In one embodiment, the conductive lines comprise first and second sidewalls. One of the sidewalls is non-vertical. In one embodiment, the angles of the non-vertical sidewalls of the adjacent conductive lines are supplementary angles. In one embodiment, the non-vertical sidewalls of adjacent conductive lines are adjacent. By providing the conductive lines with a non-rectangular shaped cross-section, a reduction in line pitch is achieved without increasing capacitive coupling noise between adjacent lines. Alternatively, for a given pitch, conductive lines with the non-rectangular shaped cross-sections reduce capacitive coupling noise between adjacent lines.

DETAILED DESCRIPTION OF THE INVENTION

Figure 1:
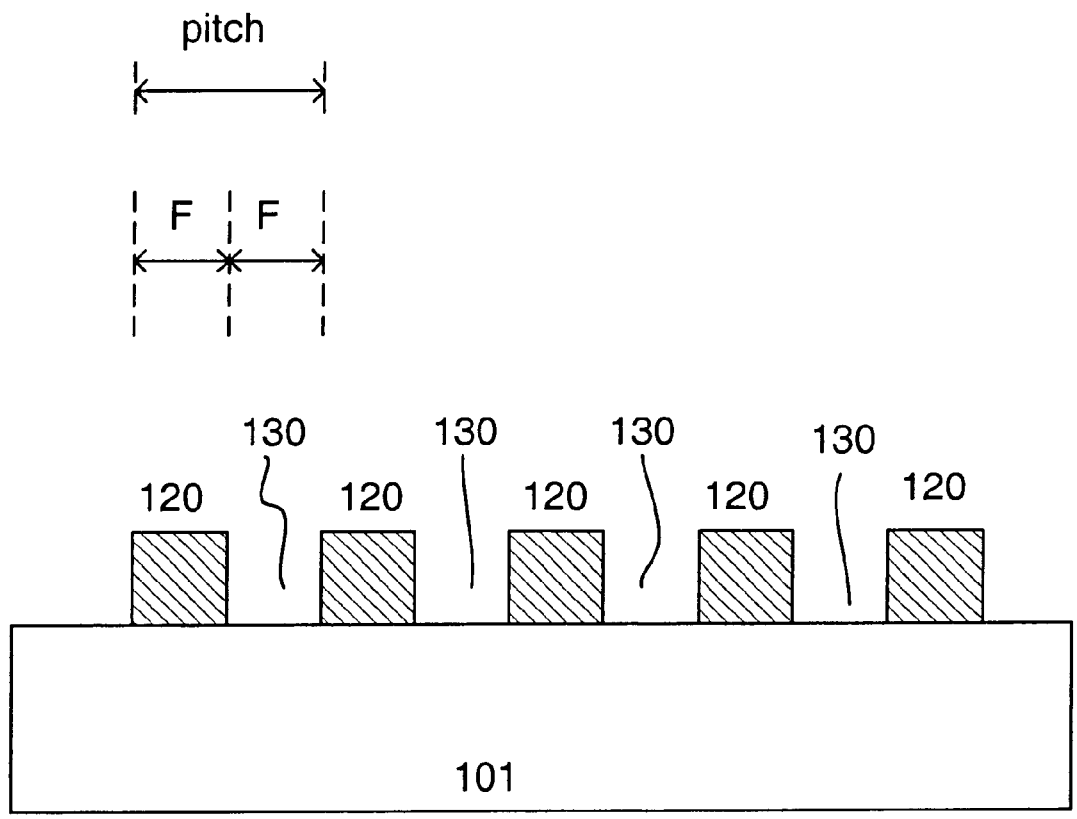
FIG. 1 shows conventional conductive lines of an integrated circuit.
Figure 2:
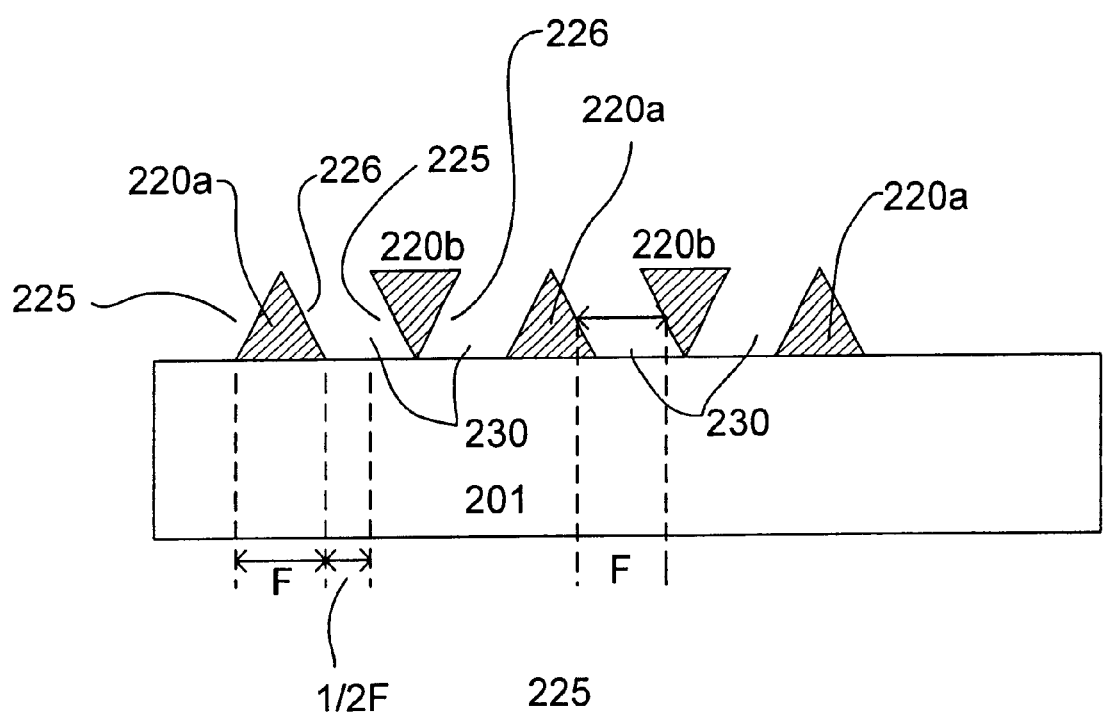
FIG. 2 shows conductive lines in accordance with one embodiment of the invention.

The invention relates to conductive lines used in integrated circuits (ICs). FIG. 2 shows conductive lines in accordance with one embodiment of the invention. As shown, a substrate 201 is provided. The substrate, for example, comprises a dielectric layer over a semiconductor substrate having circuit features formed thereon. Conductive lines 220 are formed on the substrate. The conductive lines, for example, are each about 1F in width. Contacts are provided to electrically couple the circuit features, as desired, with the conductive lines. However, for sake of simplification, the contacts and circuit features are not shown.

In accordance with the invention, the conductive lines comprise non-rectangular shaped cross-sections. The conductive lines comprise at least one non-vertical sidewall. In one embodiment, the conductive lines comprise first and second non-vertical sidewalls 225 and 226 which taper toward each other, converging to form triangular shaped cross-sections. Providing non-vertical sidewalls that do not converge is also useful. In one embodiment, the adjacent sidewalls of adjacent conductive lines have angles which are about complementary (e.g., sum of the angle of second sidewall 226 of conductive line 220a and the angle of the first sidewall 225 of conductive line 220b is equal to about 180°). As shown, the line pitch of the conductive lines is about 1.5F while the line spacing is maintained at about 1F. Thus, the use of conductive lines with non-vertical sidewalls reduces the line pitch without increasing capacitive coupling noise. Alternatively, for a given pitch, the use of conductive lines with non-rectangular shaped cross-sections reduces coupling noise between adjacent lines.

Figure 3:
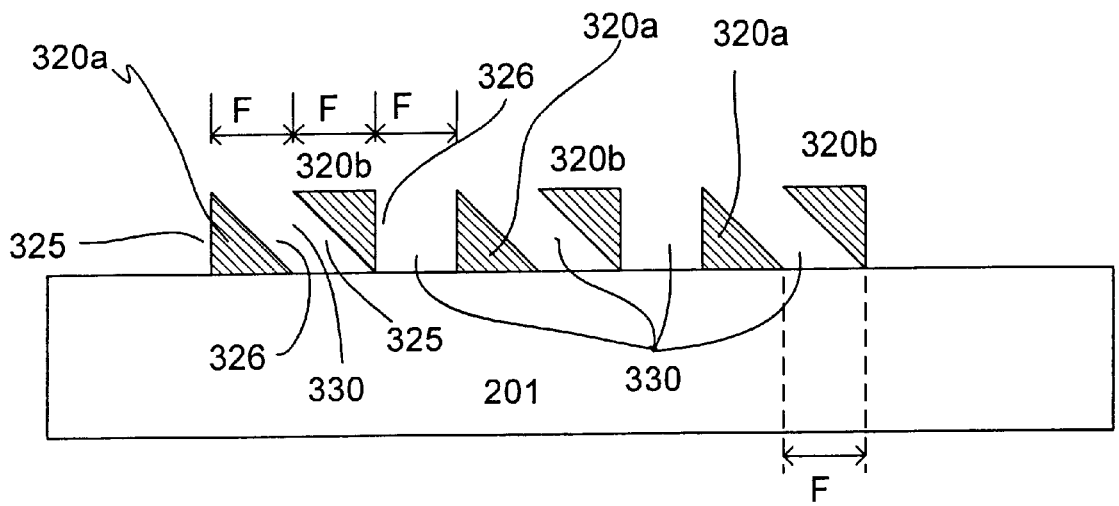
FIGS. 3–4 show conductive lines in accordance with alternative embodiments of the invention.

FIG. 3 shows an alternative embodiment of the invention. As shown, conductive lines 320 are formed on a substrate 201. The conductive lines comprise first and second sidewalls 325 and 326. In one embodiment, one of the sidewalls is substantially vertical and the second sidewall is non-vertical. Illustratively, the sidewalls converge to form conductive lines with triangular shaped cross-sections. Providing conductive lines with sidewalls that do not converge is also useful. In one embodiment, adjacent sidewalls of adjacent conductive lines have complementary angles. As shown, the average line pitch of the conductive lines is about 1.5F with line spacing of about 1F.

Figure 4:
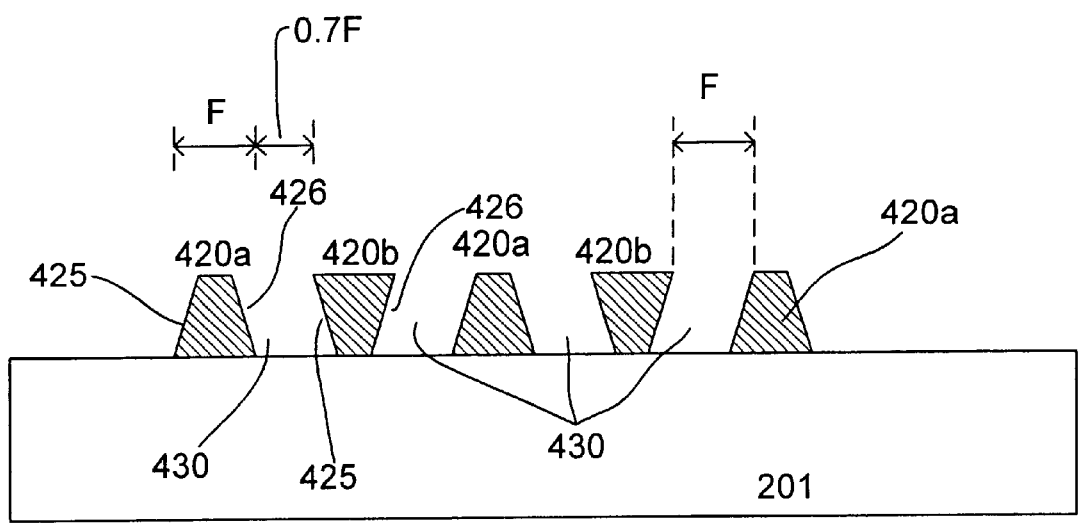

FIG. 4 shows yet an alternative embodiment of the invention. The conductive lines comprise first and second non-vertical sidewalls which taper toward each other without converging. Having sidewalls which do not taper toward each other is also useful. In one embodiment, the adjacent sidewalls comprise complementary angle. That is, for example, the sum of the angles of the second sidewall 426 of the conductive line 420a and the first sidewall 425 of conductive line 420b equal to about 180°. Such an arrangement of conductive lines result in a line pitch of less than 2F and a line spacing of 1F, thereby facilitating a smaller line pitch without increasing capacitive coupling noise between adjacent conductive lines.

Figure 5:
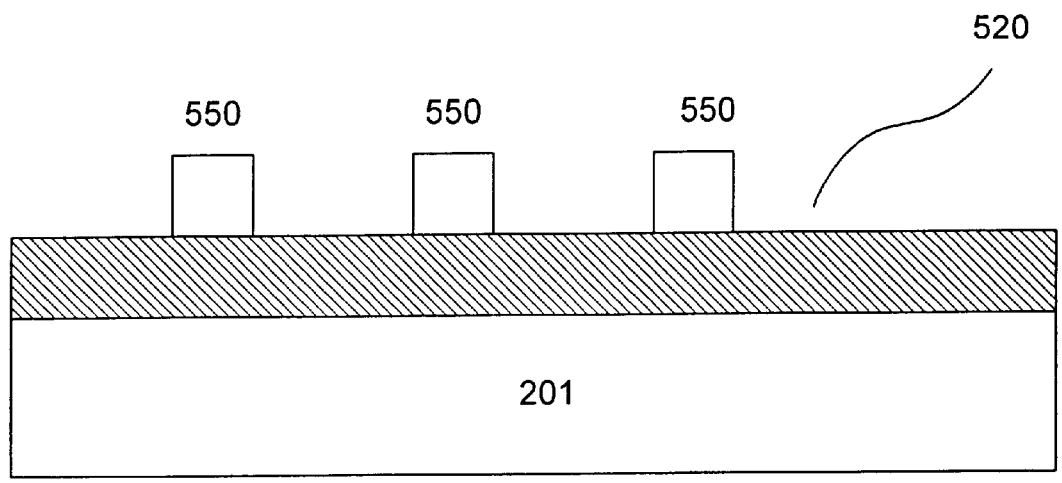
FIGS. 5–10 show a process for fabricating conductive lines in accordance with one embodiment of the invention.
Figure 6:
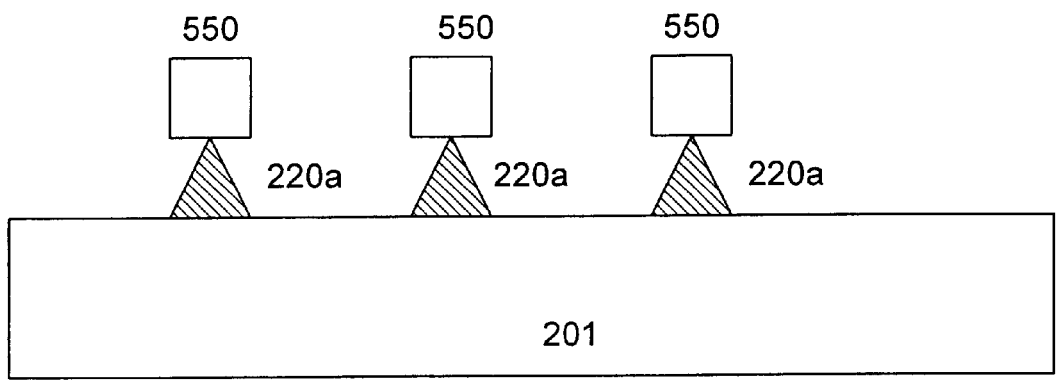
Figure 7:
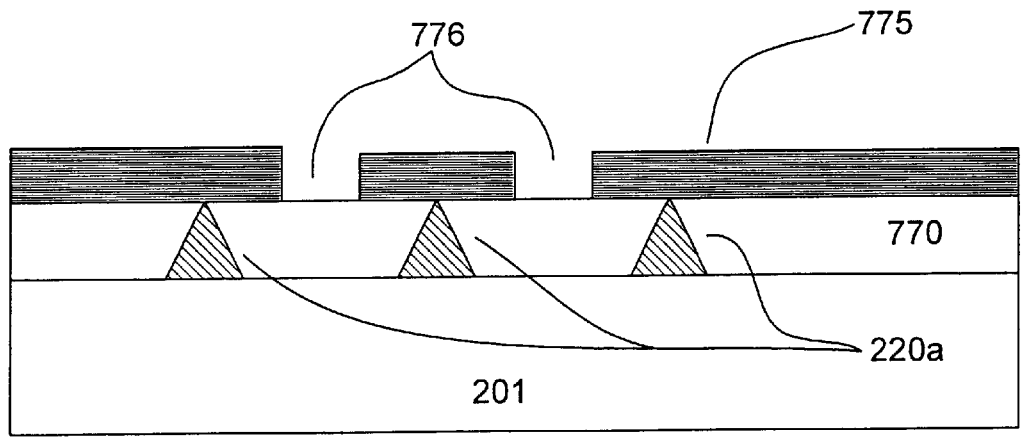

FIGS. 5–10 show a process for forming conductive lines in accordance with one embodiment of the invention. Referring to FIG. 5, a substrate 201 is provided. Above the substrate is deposited a conductive layer 520. The conductive layer comprises, for example, aluminum, copper, or alloys thereof. Other types of conductive layer can also be used. A mask layer 550, for example resist, is deposited and patterned to selectively expose portions of the conductive layer. The exposed portions of the conductive layer, as shown in FIG. 6, are removed by an isotropic etch. The isotopic etch, for example, can be a wet etch. After etching, conductive lines 220a having non-vertical sidewalls tapering toward each other are formed. In one embodiment, triangular shape conductive lines are formed. Referring to FIG. 7, a dielectric layer is deposited over the conductive lines 220a. The dielectric layer comprises, for example, silicon oxide, silicate glass, or doped silicate glass. The dielectric layer is planarized to provide a planar top surface. In one embodiment, the top surface of the dielectric layer is substantially co-planar to the top of the conductive lines. Alternatively, the dielectric layer comprises a self-planarizing layer, such as spin-on-glass. A mask layer 775 is deposited and patterned to form openings 776 between the conductive lines.

Figure 8:
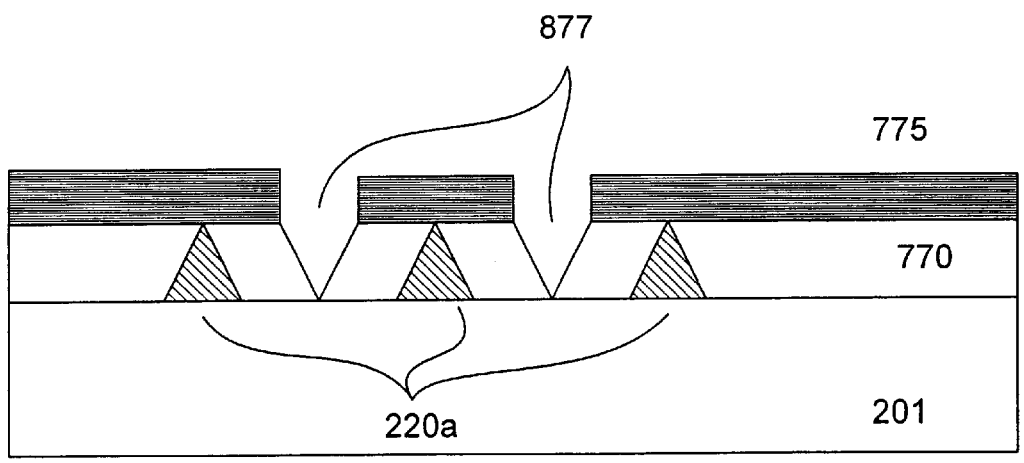

In FIG. 8, after the openings are formed, the dielectric layer is isotropically etched to form trenches 877. In one embodiment, the trenches are triangular in shape. The trenches comprise non-vertical sidewalls that taper toward each other.

Figure 9:
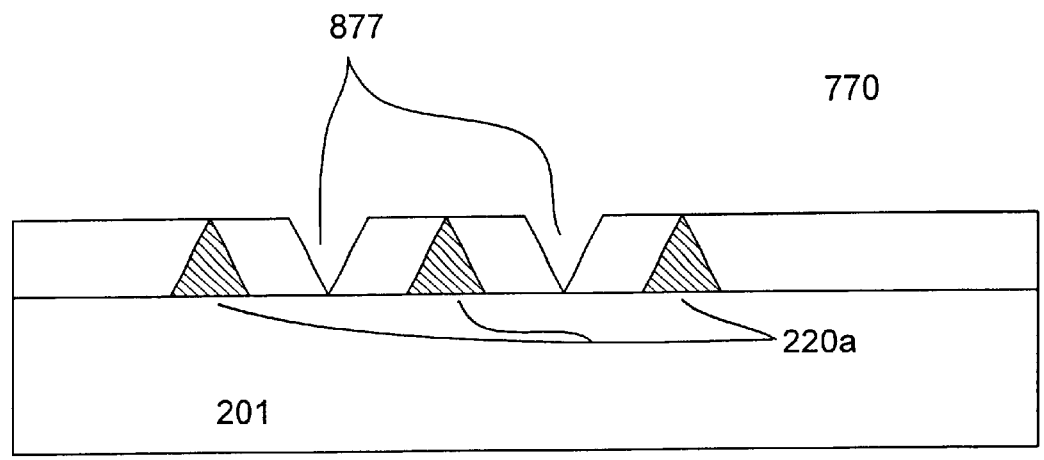
Figure 10:
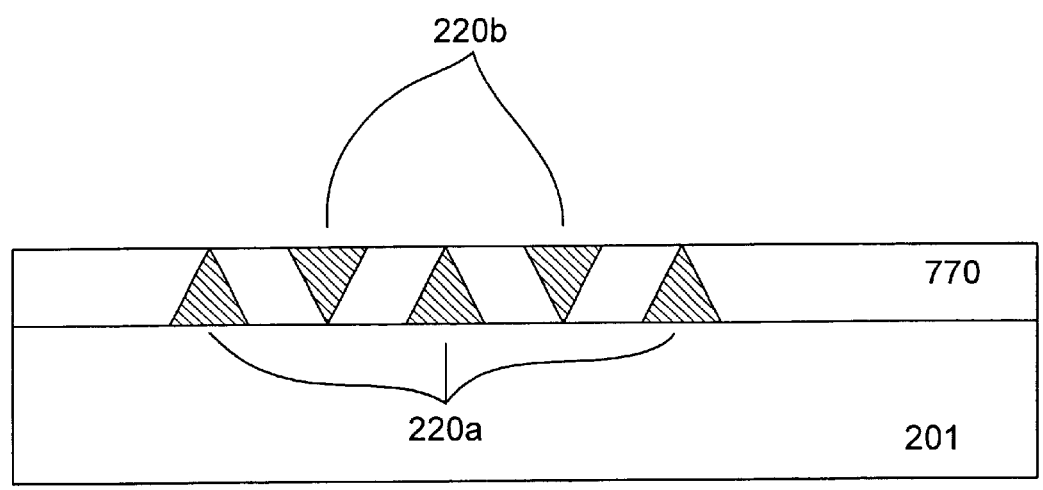

Referring to FIG. 9, the mask layer is removed. Subsequently, as shown in FIG. 10, a conductive layer is deposited over the dielectric layer to fill the trenches. The substrate is polished by, for example, chemical mechanical polishing (CMP) to remove excess conductive material, leaving conductive lines 220*b* in the trenches. Additional processing is performed to complete the IC.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:

first and second conductive lines having non-rectangular cross-sections, the cross sections have first and second sidewalls, wherein at least one of the first or second sidewalls is completely non-vertical;

adjacent sidewalls of the first and second conductive lines having angles which are about complementary; and a line space separating the first and second conductive lines, wherein the non-rectangular cross-sections of the conductive lines reduce a line pitch of the conductive lines without effectively increasing the capacitive coupling between the conductive lines.

2. The integrated circuit of claim 1 wherein the conductive lines comprise a conductive material selected from a group consisting of aluminum, copper or alloys thereof.

3. The integrated circuit of claim 1 wherein the first and second sidewalls are completely non-vertical.

4. The integrated circuit of claim 3 wherein the conductive lines comprise a conductive material selected from a group consisting of aluminum, copper or alloys thereof.

5. The integrated circuit of claim 1 wherein the line pitch is less than 2F.

6. The integrated circuit of claim 1 wherein the line pitch is about 1.5F.

7. The integrated circuit of claim 3 wherein the first sidewall tapers toward the second sidewall.

8. The integrated circuit of claim 7 wherein the line pitch is less than 2F.

9. The integrated circuit of claim 7 wherein the line pitch is about 1.5F.

10. The integrated circuit of claim 7 wherein the sidewalls of the conductive lines converge.

11. The integrated circuit of claim 10 wherein the line pitch is less than 2F.

12. The integrated circuit of claim 10 wherein the line pitch is about 1.5F.

13. The integrated circuit of claim 7 wherein non-vertical sidewalls of the first and second conductive lines are adjacent sidewalls.

14. The integrated circuit of claim 13 wherein the line pitch is less than 2F.

15. The integrated circuit of claim 13 wherein the line pitch is about 1.5F.

16. The integrated circuit of claim 1 wherein the first sidewall tapers toward the second sidewall.

17. The integrated circuit of claim 16 wherein the line pitch is less than 2F.

18. The integrated circuit of claim 16 wherein the line pitch is about 1.5F.

19. The integrated circuit of claim 16 wherein the sidewalls of the conductive lines converge.

20. The integrated circuit of claim 19 wherein the line pitch is less than 2F.

21. The integrated circuit of claim 19 wherein the line pitch is about 1.5F.

22. The integrated circuit of claims 3 or 4 wherein the sidewalls of the conductive lines converge.

23. The integrated circuit of claim 22 wherein the line pitch is less than 2F.

24. The integrated circuit of claim 22 wherein the line pitch is about 1.5F.

* * * * *